United States Patent [19]
Drake

[11] Patent Number: 5,859,553
[45] Date of Patent: Jan. 12, 1999

[54] SYSTEM AND METHOD FOR A GLITCHLESS TRANSITION BETWEEN DIFFERING DELAY PATHS

[75] Inventor: Rodney J. Drake, Phoenix, Ariz.

[73] Assignee: Microchip Technology Incorporated, Chandler, Ariz.

[21] Appl. No.: 779,804

[22] Filed: Jan. 8, 1997

[51] Int. Cl.[6] .............................. H03K 5/159; H03K 17/16
[52] U.S. Cl. ............................ 327/276; 327/400; 327/99; 327/403
[58] Field of Search ...................... 327/276, 277, 327/278, 99, 298, 400, 384, 403

[56] References Cited

U.S. PATENT DOCUMENTS

| | | | |
|---|---|---|---|
| 4,504,749 | 3/1985 | Yoshida | 327/276 |
| 4,748,417 | 5/1988 | Spengler | 327/99 |
| 4,855,615 | 8/1989 | Humpleman | 327/298 |
| 5,357,146 | 10/1994 | Heimann | 327/298 |
| 5,483,185 | 1/1996 | Scriber et al. | 327/99 |
| 5,623,223 | 4/1997 | Pasqualini | 327/99 |
| 5,652,536 | 7/1997 | Nookala et al. | 327/99 |

*Primary Examiner*—Timothy P. Callahan
*Assistant Examiner*—Terry L. Englund
*Attorney, Agent, or Firm*—Harry M. Weiss; Jeffrey D. Moy; Harry M. Weiss & Associates, P.C.

[57] ABSTRACT

A system for switching between a signal having delay paths of differing magnitudes without generating any glitches and false edges uses a no delay circuit for outputting a signal having no delay and a delay output circuit for outputting a delayed form of the signal. The signals are inputted to a multiplexer. The multiplexer will output at least one of the signals. Control circuitry is coupled to the multiplexer for signalling the multiplexer to output at least one of the signals. The control circuitry will control the switching of the multiplexer so that when the output of the multiplexer switches from a signal having no delay to a delayed form of the signal, or when the output of the multiplexer switches from a delayed form of the signal to a signal having no delay, no glitches or false edges are generated.

19 Claims, 3 Drawing Sheets

SYSTEM AND METHOD FOR A GLITCHLESS TRANSITION BETWEEN DIFFERING DELAY PATHS

BACKGROUND OF THE INVENTION

1. Field of the Invention

This invention relates generally to delay systems and, more specifically, to a system and method that is able to switch between delay paths of differing magnitudes without creating any glitches or false edges.

2. Description of the Prior Art

Microcontrollers such as MICROCHIP TECHNOLOGY's PIC17C56 have a peripheral that is commonly referred to as a Synchronous Serial Port (SSP). The SSP is capable of supporting two serial communication protocols. The two protocols are the Serial Peripheral Interface (SPI) and the Inter-Integrated Circuit ($I^2C$). The SSP can only support one of these protocols at a time.

While incorporating a serial protocol on the SSP, it is necessary to select between two signals that are differing delayed versions of the same input signal. The $I^2C$ protocol requires the selection to be made without creating any glitches or false edges during the transition between the differing delay paths. The $I^2C$ protocol requires devices connected.to the bus to filter out any glitches of less than a certain amount (i.e., typically around 50 ns) on the input signals. For most SSP modules, the filtering of glitches is typically done by a circuit known as a pulse gobbler. The pulse gobbler uses weak devices and capacitors to delay the input signals for a period of time greater than the maximum glitch required to be filtered. Thus, if the input changes back to its initial state before it is allowed, the transition will be ignored. The filtering of the glitches is only required for the $I^2C$ protocol. Since charging and discharging capacitors consume power, it is desirable to only have the pulse gobbler functioning when the SSP is operating in the $I^2C$ mode.

The $I^2C$ bus consists of two lines, a data line and a clock line. The $1^2C$ protocol defines that a transition on the data line while the clock line is high generates either a start bit or a stop bit. Thus, it is essential not to create any false edges on the data line when enabling and disabling the pulse gobbler.

Therefore a need existed to provide an improved system and method that is able to switch between delay paths of differing magnitudes. The improved system and method must be able to switch between delay paths of differing magnitudes without creating any glitches or false edges. This will allow a Synchronous Serial Port (SSP) operating under an Inter-Integrated Circuit ($I^2C$) protocol to switch between the differing delay versions of the same input signal without generating any glitches or false edges during the transition.

SUMMARY OF THE INVENTION

In accordance with one embodiment of the present invention, it is an-object of the present invention to provide an improved system and method for delaying an input signal.

It is another object of the present invention to provide an improved system and method that is able to switch between delay paths of differing magnitudes without creating any glitches or false edges.

It is still another object of the present invention to provide an improved system and method that is able to switch between delay paths of differing magnitudes without creating any glitches or false edges in order to allow a Synchronous Serial Port (SSP) operating under an Inter-Integrated Circuit ($I^2C$) protocol to switch between signals that are differing delay versions of the same input signal without generating any glitches or false edges during the transition.

BRIEF DESCRIPTION OF THE PREFERRED EMBODIMENTS

In accordance with one embodiment of the present invention, a system for switching between a signal having delay paths of differing magnitudes without generating any glitches and false edges is disclosed. The system has no delay circuit means for outputting a signal having no delay. Delay output circuit means are provided for outputting a delayed form of the signal. Multiplexer means are provided and have a first input coupled to an output of the no delay circuit means and a second input coupled to an output of the delay output circuit means. The multiplexer means is used for outputting at least one of the two signals (i.e., a signal having no delay or a delayed form of the signal). Control means are provided and are coupled to the multiplexer means. The control means are used for signalling the multiplexer means to output at least one of the two signals (i.e., a signal having no delay or a delayed form of the signal). The control means are also used for controlling the switching of an output of the multiplexer so that when the output of the multiplexer switches from a signal having no delay to a delayed form of the signal, or when the output of the multiplexer switches from a delayed form of the signal to a signal having no delay, no glitches or false edges are generated.

In accordance with another embodiment of the present invention, a method of providing a system for switching between delay paths of differing magnitudes without generating any glitches and false edges is disclosed. The method comprises the steps of: providing no delay circuit means for outputting a signal having no delay; providing delay output circuit means for outputting a delayed form of the signal; providing multiplexer means having a first input coupled to an output of the no delay circuit means and a second input coupled to an output of the delay output circuit means for outputting one of the two signals (i.e., a signal having no delay or a delayed form of the signal); and providing control means coupled to the multiplexer means for signalling the multiplexer means to output one of the two signals (i.e., a signal having no delay or a delayed form of the signal) and for controlling the switching of an output of the multiplexer means so that when said output of said multiplexer means switches from a signal having no delay to a delayed form of the signal, or when the output of the multiplexer means switches from a delayed form of the signal to a signal having no delay, no glitches or false edges are generated.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 3:
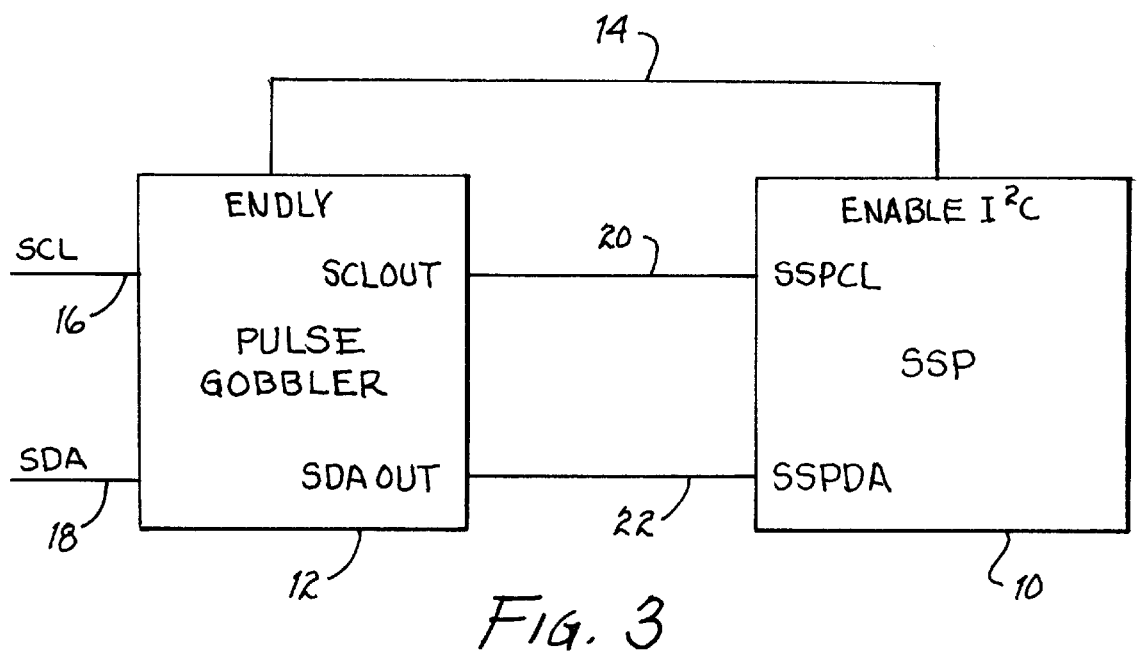
FIG. 3 is a simplified block diagram of a SSP module which will require the implementation of the system depicted in FIG. 1 in order to switch between delay paths of differing magnitudes without creating any glitches or false edges.

Referring to FIG. 3, a Synchronous Serial Port (SSP) 10 is able to activate or deactivate a pulse gobbler 12 by controlling the Enable Delay (ENDLY) signal on a signal line 14 (i.e., ENDLY=1 enabled, ENDLY=0 disabled). As can be seen from FIG. 3, the pulse gobbler 12 has a clock input line 16 for receiving a clock signal (SCL) and a data input line 18 for receiving a data signal (SDA). Both the SCL signal and the SDA signal are run through the pulse gobbler 12 in order to filter out glitches in both signals that are less than a predetermined amount (i.e., typically 50 ns). The filtered signals are then outputted from the pulse gobbler 12. The outputted clock signal (SCLOUT) is sent to the SSP via SSP clock input line 20, while the outputted data signal (SDAOUT) is sent to the SSP 10 via SSP data input line 22.

Figure 1:
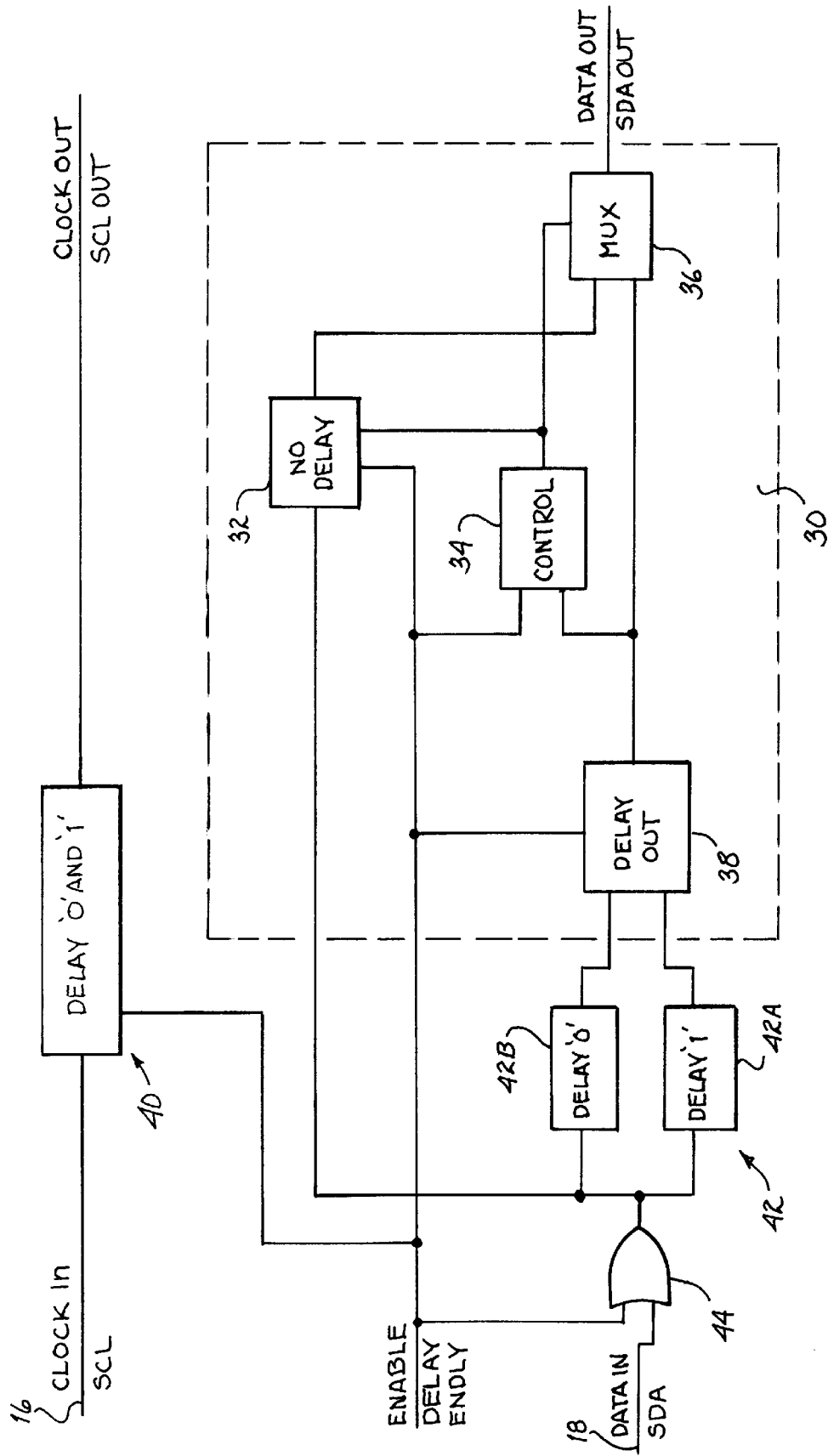
FIG. 1 is a simplified functional block diagram of a system which is able to switch between delay paths of differing magnitudes without creating any glitches or false edges.

Referring to FIG. 1, a system 30 is shown which is able to select between two signals that are differing delay versions of the same input signal without generating any glitches or false edges during the transition between the differing delay paths. The Enable Delay (ENDLY) signal which is used to activate and deactivate the pulse gobbler 12 (FIG. 3) is also used as a control signal for the system 30.

When the ENDLY signal is low, the ENDLY signal is inactive and the delay output circuitry 38 is disabled. Thus, the outputted clock signal (SCLOUT) is held in a specific state, and the outputted data signal (SDAOUT) matches the input data signal (SDA) to the pulse gobbler 12 (FIG. 3) without any delay. The control of the outputted data signal (SDAOUT) is accomplished in the following manner. A no delay circuit 32 has a first input coupled to the ENDLY signal, a second input coupled to the data input line 18, and a third input coupled to an output of a control circuitry 34. When the ENDLY signal is low, the no delay circuit 32 will allow the data on the data input line 18 to pass through the no delay circuitry 34 with virtually no delay. The control circuit 24 selects the output of the no delay circuit 32 to pass through a multiplexer 36. The multiplexer 36 will drive the outputted data (SDAOUT) to an input of the SSP 10 (FIG. 3) with basically no delay.

When the ENDLY signal is high, the delay output circuitry 38 is activated. The outputted clock signal (SCLOUT) becomes a delayed form of the clock signal (SCL) on the clock input line 16 due to the clock delay circuitry 40 also being enabled by the ENDLY signal. The outputted data signal (SDAOUT) becomes a delayed form of the data signal (SDA) on the data input line 18. However, what is unique about the present system 30 is that the transition from a no-delayed state to a delayed state is done in such a way that no glitches or false edges occur on the outputted data signal (SDAOUT). The transition of the control of the outputted data signal (SDAOUT) occurs in the following manner. When the ENDLY signal goes high, the output of the no delay circuit 32 is latched at the value of the data signal (SDA) at the instant the ENDLY signal goes high (i.e., goes active). The data delay circuitry 42 coupled to the data input line 18 also becomes activated. When the output of the delay output circuitry 38 transitions, the control circuitry 34 selects the output of the delay output circuitry 38 to pass through the multiplexer 36 which drives the outputted data signal (SDAOUT) to an input of the SSP 10. The control circuitry 34 also then allows the no delay circuitry 32 to pass the inputted data signal (SDA) through, however, this signal is not outputted by the multiplexer 36. Thus, the outputted data signal (SDAOUT) will be a delayed form of the inputted data signal (SDA), and no glitches are created in going from the non-delayed state to the delayed state.

When ENDLY is deactivated, the outputted data signal (SDAOUT) transitions from a delayed state to a non-delayed state. When this occurs, the control circuitry 34 selects the output of the no delay circuitry 32 to pass through the multiplexer 36. The clock delay circuitry 40 and the data delay circuitry 42 are both disabled. Since the no delay circuitry 32 is already passing through the inputted data signal (SDA), there will be no glitches in the outputted data signal (SDA) when the transition from a delayed state to a non-delayed state is performed.

Figure 2:
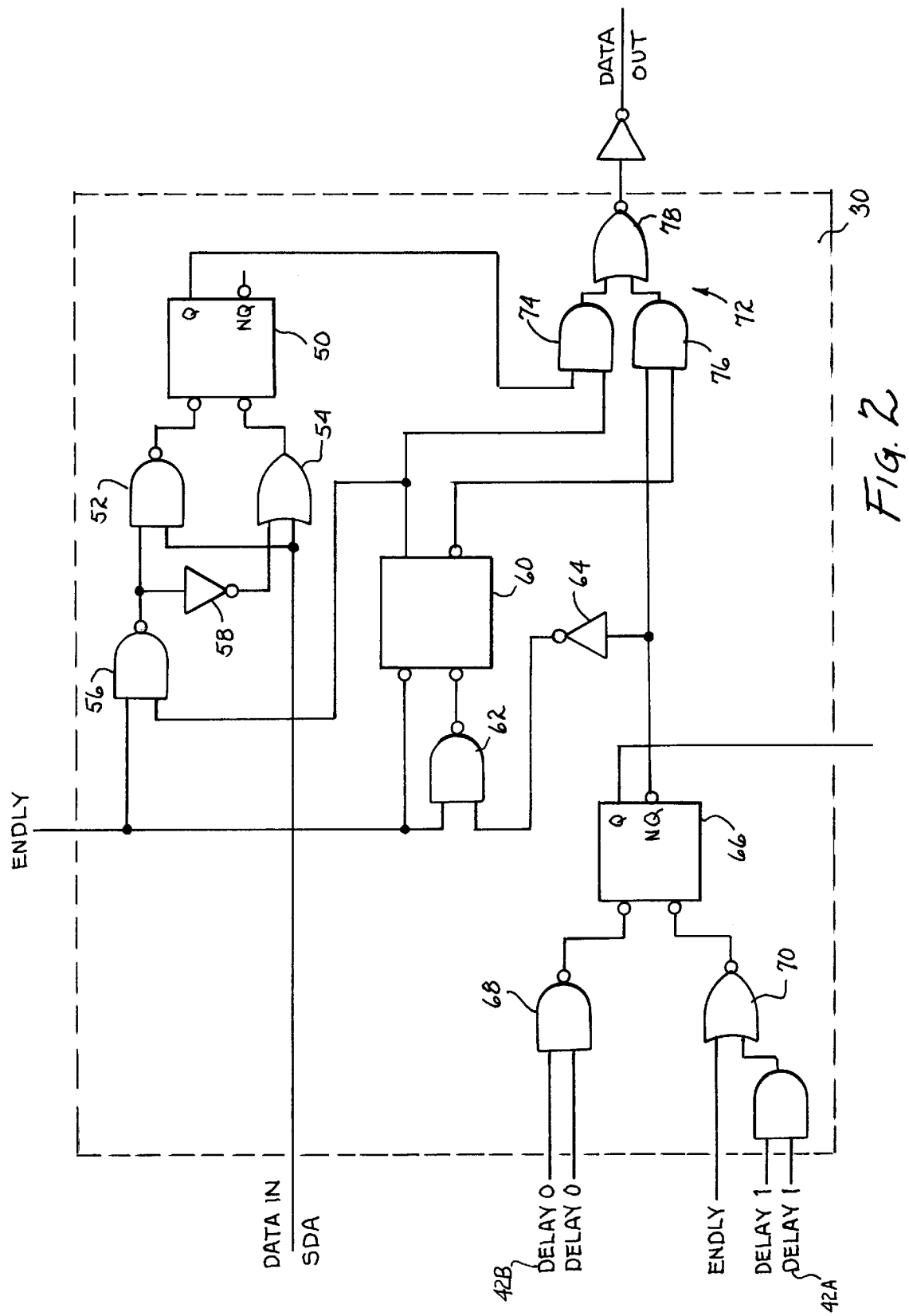
FIG. 2 is a simplified electrical schematic of the system depicted in FIG. 1.

Referring to FIG. 2, a simplified electrical schematic of the system 30 is shown. When the ENDLY signal is low, NAND gate 56 and the inverter 58 allow NAND gate 52 and OR gate 54 to control the Q output of latch 50 such that the Q output is equal to the input data signal (SDA). The low ENDLY signal also forces the latch 60 to signal the multiplexer 72 to select the Q output of latch 50 to be outputted. Thus when the ENDLY signal is low (i.e., ENDLY=0), the outputted data signal (SDAOUT) matches the input data signal (SDA) with basically no delay.

When the pulse gobbler 12 (FIG. 3) is enabled, the ENDLY signal goes high (i.e., ENDLY=1). When the ENDLY signal goes high, NAND gate 56 and the inverter 58 do not allow NAND gate 52 and OR gate 54 to change the output of latch 50. Thus, the Q output of latch 50 holds the value of the input data signal (SDA) at the time the pulse gobbler 12 (FIG. 3) was enabled. The ENDLY signal is also no longer solely in control of latch 60 which directs the multiplexer 72 to select a delayed or non-delayed version of the input data signal (SDA). Latch 60 will not cause the multiplexer 72 to select the NQ output of latch 66 (i.e., the delayed version of the input data signal (SDA)) until the output of the NAND gate 62 goes low. The output of the NAND gate 62 will only go low when the both inputs to the NAND gate 62 are low. One input to the NAND gate 62 is coupled to the ENDLY signal which is high when the pulse gobbler is active. The other input is coupled to an output of an inverter 64 which has an input coupled to the NQ output of latch 66.

When the pulse gobbler 12 (FIG. 3) is disabled (i.e., ENDLY=0), the data delay circuitry 42 (FIG. 1) must be forced into one state or the other (i.e., High State or Low State). The output of the OR gate 44 (FIG. 1) is forced high when the pulse gobbler 12 (FIG. 3) is disabled, and NOR gate 70 forces the NQ output of latch 66 high. With NQ=1, the output of the inverter 64 will be low, and thus, the output of the NAND gate 62 will be high when the ENDLY signal goes high. Therefore, latch 60 is still forcing the multiplexer 72 to choose the Q output of the latch 50 to control the outputted data (SDAOUT) and no glitch occurs when the pulse gobbler 12 (FIG. 3) is activated.

After the ENDLY signal goes high, the output of the OR gate 44 is not forced high, but instead is equal to the value of the input data signal (SDA). If the inputted data signal (SDA) is high when the pulse gobbler 12 (FIG. 3) is enabled, the delay through the DELAY path 1 42A has already been satisfied, and therefore, the AND gate 71, which is coupled to the DELAY path 1 42A, will force the output of the NOR gate low. The output of the NOR gate 70 forces the NQ output of latch 66 to remain high. If the inputted data signal (SDA) is low when the pulse gobbler 12 (FIG. 3) is enabled or goes low after the pulse gobbler 12 (FIG. 3) is enabled, the path through DELAY path 0 42B is activated. The output of the AND gate 71 goes low when the SDA signal goes low, and this causes the output of the NOR gate 70 to go high. Therefore, the NQ output of the latch 66 is no longer forced high by the output of the NOR gate 70. If the inputted data signal (SDA) stays low for a longer period than the delay through DELAY path 0 42B, the output of the NAND gate 68 will force the NQ output of the latch 66 low. This causes the output of the inverter 64 to go high. In return, the NAND gate 62 causes the output of the latch 60 to switch and force the multiplexer 72 to select the NQ output of the latch 66. Since the NQ output is low, the outputted data signal (SDAOUT) will be a delayed version of the inputted data signal (SDA) without any glitches.

When latch 60 switches and causes the multiplexer 72 to select the delayed version of the inputted data signal (SDA) without any glitches, the NAND gate 56 and the inverter 58 again allow the NAND gate 52 and the OR gate 54 to control the latch 50. Therefore, when the pulse gobbler 12 (FIG. 3) is eventually io disabled, no glitch will occur on the outputted data signal (SDAOUT) because the output of the latch 50 will already have the current value of the inputted data signal (SDA) when the multiplexer 72 again selects the Q output of latch 50.

While the invention has been particularly shown and described with reference to preferred embodiments thereof, it will be understood by those skilled in the art that the foregoing and other changes in form, and details may be made therein without departing from the spirit and scope of the invention.

I claim:

1. A system for switching between delay paths of differing magnitudes without generating any glitches and false edges comprising, in combination:

no delay circuit means for outputting a signal having no delay, with respect to an input signal;

delay output circuit means for outputting a delayed form of said input signal;

multiplexer means having a first input coupled to said output of said no delay circuit and a second input coupled to said output of said delay circuit means for outputting one of said signal having no delay or said delayed form of said input signal;

control means couple to said muitiplexer means for signalling said multiplexer means to output one of said signal having no delay or said delayed form of said input signal and for controlling the switching of said output of said multiplexer means so that when said outputof said multiplexer means switches from said signal having no delay to said delayed form of said input signal and when said output of said multiplexer means switches from said delayed form of said input signal to said signal having no delay, no glitches and false edges are generated;

delay circuit means having an input coupled to said input signal and an output coupled to said delay output circuit means for generating said delayed form of said input signal; and enable signal means coupled to said delay circuit means for controlling when said delay circuit means is active and inactive and further coupled to said control mean for said delay form of said control means to switch said output of said multiplexer means from said signal having no delay to said delayed form of said input, signal and from said delayed form of said input signal to said signal having no delay so that no glitches and false edges are generated and outpulled by said multiplexer means;

wherein said no delay circuit means comprises:

no delay circuit latch means for outputting said signal having no delay; and no delay circuit logic gate means having a first input coupled to said input signal, a second input coupled to said control means, a third input coupled to said enable signal mean, and an output coupled to said no delay circuit latch means generating a signal to control said output of said no delay circuit latch means.

2. The system of claim 1 wherein said no delay circuit, logic gate means comprises:

a first NAND gate having a first input coupled to said enable signal means and a second input coupled to said control means;

a second NAND gate having a first input coupled to an output of said first NAND gate, a second input coupled to-said input signal, and an output coupled to said no delay circuit latch means;

an inverter having an input coupled to said output of said first NAND gate; and an OR gate having a first input. coupled to an output of said inverter, a second input coupled to said input signal, and an output coupled to said no delay circuit latch means.

3. The system of claim 1 wherein said delay output circuit means comprises:

delay output circuit latch means for outputting said delayed form of said input signal; and delay output circuit logic gate means having a first input coupled to said delay circuit means, a second input coupled to said enable signal means, and an output coupled to said delay output circuit latch means for generating a signal to control said output of said delay output circuit latch means.

4. The system of claim 3 wherein said delay output circuit logic gate means comprises:

a NAND gate coupled to said delay circuit means and having an output coupled to said delay output circuit latch means;

an AND gate coupled to said delay circuit means; and a NOR gate having a first input coupled to said enable signal means, a second input coupled to an output of said AND gate, and an output coupled to said delay output circuit latch means.

5. The system of claim 1 wherein said control means comprises;

control latch means having an output coupled to said enable signal means and outputs coupled to said multiplexer means for signalling said multiplexer means to output one of said signal having no delay outputted from said no delay circuit means or said delay form of said input signal outputted from said delay output circuit means; and control logic gate means having a first input coupled to said enable signal means, a second input coupled to said delay output circuit means, and an output coupled to said control latch means for sending a signal to said control latch means to signal said multiplexer means to output said delayed form of said input signal outputted from said delay output circuit means.

6. The system of claim 5 wherein said control logic gate means comprises:
   an inverter having an input coupled to said delay output circuit means; and
   a NAND gate having a first input coupled to said enable signal means, a second input coupled to an output of said inverter, and an output coupled to said control latch means.

7. The system of claim 1 wherein said multiplexer means comprises:
   a first AND gate having a first input coupled to said no delay circuit means and a second input coupled to said control means;
   a second AND gate having a first input coupled to said delay output circuit means and a second input coupled to said control means; and
   a NOR gate having a first input coupled to an output of said first AND gate and a second input coupled to an output of said second AND gate.

8. A method of providing a system for switching between delay pathes differing magnitudes without generating any glitches and false edges comprising the steps of:
   providing no delay circuit means for outputting a signal having no delay, with respect to an input signal;
   providing delay output circuit means for outputting a delayed form of said input signal;
   providing multiplexer means having a first input coupled to said output of said no delay circuit means and a second input coupled to said output of said delay output circuit means for outputting one of said signal having no delay or said delayed form of said input siqnal;
   providing control means coupled to said multiplexer means for signaling said multiplexer means to output one of said signal having no delay or said delayed form of said input signal and for controlling the switching of said output of said multiplexer means so that when said output of said multiplexer means switches from said signal having no delay to said delayed form of said input signal and when said output of said multiplexer means switches from said delayed form of said input signal to said signal having no delay, no glitches and false edges are generated;
   providing delay circuit means having an input coupled to said input signal and all output coupled to said delay output circuit means for generating said delayed form of said input signal; and
   providing enable signal means coupled to said delay circuit means for controlling when said delay circuit means is active and inactive and further coupled to said control means for signalling said control means to switch said output of said multiplexer means from said signal having no delay to said delayed form of said input signal and from said delayed form of said input signal to said signal having no delay so that no glitches and false edges are generated and outputted by said multiplexer means;
   wherein said step of providing no delay circuit means further comprises the steps of:
      providing no delay circuit latchmeans for outputting said signal having no delay; and
      providing no delay circuit logic gate means having a first input coupled to said input signal, a second input coupled to said control means, a third input coupled to said enable signal means, and an output coupled to said no delay circuit latch means for generating a signal to control said output of said no delay circuit latch means.

9. The method of claim 8 wherein said step of providing no delay circuit logic gate means further the steps of:
   providing A first NAND gate having a first input coupled to said enable signal means and a second input coupled to said control means;
   providing a second NAND gate having a first input coupled to an output of said first NAND gate, a second input coupled to said input signal, and an output coupled to said no delay circuit latch means;
   providing an inverter having an input coupled to said output of said first NAND gate; and
   providing an OR gate having a first input coupled to an output of said inverter, a second input coupled to said input signal, and an output coupled to said no delay circuit latch means.

10. The method of claim 8 wherein said step of providing delay output circuit means further comprises the steps of:
   providing delay output circuit latch means for outputting said delayed form of said input signal; and
   providing delay output circuit logic gate means having a first input coupled to said delay circuit means, a second input coupled to said enable signal means, and an output coupled to said delay output circuit latch means for generating a signal to control said output of said delay output circuit latch means.

11. The method of claim 10 wherein said step of providing delay output circuit logic gate means further comprises the steps of:
   providing a NAND gate coupled to said delay circuit means and having an output coupled to said delay output circuit latch means;
   providing an AND gate coupled to said delay circuit means; and
   providing a NOR gate having a first input coupled to said enable signal means, a second input coupled to an output of said AND gate, and an output coupled to said delay output circuit latch means.

12. The method of claim 8 wherein said step of providing control means further comprises the steps of:
   providing control latch means having an input coupled to said enable signal means and outputs coupled to said multiplexer means for signalling said multiplexer means to output one of said signal having no delay outputted from said no delay circuit means or said delayed form, of said input signal outputted from said delay output circuit means; and
   providing control logic gate means having a first input coupled to said enable signal. means, a second input coupled to said delay output circuit means, and an output coupled to said control latch means for sending a signal to said control latch means to signal said multiplexer to output said delayed form of said input signal outputted from said delay-output circuit means.

13. The method of claim 12 wherein said step of providing control logic gate means further comprises the steps of:
   providing an inverter having an input coupled to said delay output circuit means; and
   providing a NAND gate having a first input coupled to said enable signal means, a second input coupled to an output of said inverter, and an output coupled to said control latch means.

14. The method of claim 8 wherein said step of providing multiplexer means further comprises the steps of:
   providing a first AND gate having a first input coupled to said no delay circuit means and a second input coupled to said control means;

providing a second AND gate having a first input coupled to said delay output circuit means and a second input coupled to said control means; and providing a NOR gate having a first input coupled to an output of said first AND gate and a second input coupled to an output of said second AND gate.

15. A system for switching between delay paths of differing magnitudes without generating any glitches and false edges comprising, in combination:

no delay circuit means for outputting a signal having no delay, with respect to an input signal, said no delay circuit means comprising:

no delay circuit latch means for outputting said signal, having no delay; and no delay circuit logic gate means having a first input coupled to said input signal, a second input coupled to a control means, a third input coupled to an enable signal means, and an output coupled to said no delay circuit latch means for generating a signal to control said no delay circuit latch means;

delay output circuit means for outputting a delayed form of said input signal, said delay output circuit means comprising:

delay output circuit latch means for outputting said delayed form of said input signal; and delay output circuit logic gate means having a first input coupled to a delay circuit means, a second input coupled to said enable signal means, and an output coupled to said delay output circuit latch means for generating a signal to control said delay output circuit latch means;

multiplexer means having a first input coupled to said no delay circuit means, a second input coupled to said delay output circuit means, and a third input coupled to said control means for outputting one of said signal having no delay or said delayed form of said input signal;

said control means coupled to said multiplexer means for signalling said multiplexer means Lo output one of said signal haviriq no delay and said delayed form of said input signal and for controlling the switching of said output of said multiplexer mean so that when said output of said multiplexer means switches from said signal having no delay to said delayed form of said input signal and when said output of said multiplexer means switches from said delayed form ot said input signal to said signal having no delay, no glitches and false edges are generated, said control means comprising:

control latch means having an input coupled to said enable signal means and outputs coupled to said multiplexer means for signalling said muitiplexer means to output one of said signal having no delay outputted from said no delay circuit means or said delayed form of said input signal outputted from said delay output circuit means; and control logic gate means having a first input coupled to said enable signal means, a second input coupled to said delay output circuit means, and an output coupled to said control latch means for sending a signal to said control latch means to signal said multiplexer to output said delayed form of said input signal outputted from said delay output circuit means;

said delay circuit means having an input coupled to said input signal and an output coupled to said delay output circuit means for generating said delayed form of said input signal; and said enable signal means coupled to said delay circuit means and to said control means for controlling when said delay circuit means is active and inactive and for signalling said control means to switch said output of said multiplexer means from said signal having no delay to said delayed form of said input signal and from said delayed form of said input signal to said signal having no delay so that no glitches and false edges are generated and outputted by said multiplexer means.

16. The system of claim 15 wherein said no delay circuit logic gate means comprises:

a first NAND gate having a first input coupled to said enable signal means and a second input coupled to said control means;

a second NAND gate having a first input coupled to an output of said first NAND gate, a second input coupled to said input signal, and an output coupled to said no delay circuit latch means;

an inverter having an input coupled to said output of said tirit NAND gate; and an OR gate having a first input coupled to an output of said inverter, a second input coupled to said input signal, and an output coupled to said no delay circuit latch means.

17. The system of claim 15 wherein said delay output circuit logic gate means comprises:

a NAND gate coupled to said delay circuit means and having an output coupled to said delay output circuit latch means;

an AND gate coupled to said delay circuit means; and a NOR gate having a first input coupled to said enable signal means, a second input coupled to an output of said AND gate, and an output coupled to said delay output circuit latch means.

18. The system of claim 15 wherein said control logic gate means comprises:

an inverter having an input coupled to said delay output circuit means; and a NAND gate having a first input coupled to said enable signal means, a second input coupled to an output of said inverter, and an output coupled to said control latch means.

19. The system of claim 15 wherein said multiplexer means comprises:

a first AND gate having a first input coupled to said no delay circuit means and a second input coupled to said control means;

a second AND gate having a first input coupled to said delay output circuit means and a second input coupled to said control means; and a NOR gate having a first input coupled to an output of said first AND gate and a second input coupled to an output of said second AND gate.

* * * * *